United States Patent
deVilliers

(10) Patent No.: US 9,645,495 B2
(45) Date of Patent: May 9, 2017

(54) CRITICAL DIMENSION CONTROL IN PHOTO-SENSITIZED CHEMICALLY-AMPLIFIED RESIST

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/816,587

(22) Filed: Aug. 3, 2015

(65) Prior Publication Data

US 2016/0048080 A1 Feb. 18, 2016

Related U.S. Application Data

(60) Provisional application No. 62/036,946, filed on Aug. 13, 2014.

(51) Int. Cl.
*G03F 7/20* (2006.01)
*G03F 7/004* (2006.01)
*G03F 7/095* (2006.01)

(52) U.S. Cl.
CPC .......... *G03F 7/2022* (2013.01); *G03F 7/0045* (2013.01); *G03F 7/095* (2013.01)

(58) Field of Classification Search
CPC .................................................. G03F 7/2022
See application file for complete search history.

(56) References Cited

U.S. PATENT DOCUMENTS 5,308,744 A * 5/1994 Koes ...................... C07C 309/71
430/165
2006/0204903 A1* 9/2006 Choi ...................... H01L 51/56
430/321

(Continued)

FOREIGN PATENT DOCUMENTS

TW 200303573 9/2003
TW 200702913 1/2007
TW 200717180 5/2007

OTHER PUBLICATIONS

PCT International Patent Application No. PCT/US2015/043433, "International Search Report and Written Opinion," mailing date Oct. 29, 2015, International Filing Date Aug. 3, 2015.

(Continued)

*Primary Examiner* — Kathleen Duda

(57) ABSTRACT

Resist compositions for photosensitive chemically amplified resist processing, as well as methods for processing substrates using a photosensitive chemically amplified resist are disclosed for improved CD uniformity. A resist composition or layer generates photosensitizer when the resist is exposed to a first wavelength of light. A second wavelength of light is later used to amplify an acid reaction. The radiation-sensitive layer also includes a photo-active agent that, when exposed to a third light wavelength, modifies a concentration of photosensitizer in the radiation-sensitive layer. The third light wavelength can be projected as a pattern of radiation using a digital pixel-based projection system, with the projected pattern based on a critical dimension signature. In a subsequent exposure step, the resist layer is exposed to light of the second wavelength that induces or amplifies the acid concentration within the photoresist film.

16 Claims, 3 Drawing Sheets

(56) References Cited

U.S. PATENT DOCUMENTS

| | | | |
|---|---|---|---|
| 2010/0119960 A1 | 5/2010 | Fonseca et al. | |
| 2011/0147984 A1* | 6/2011 | Cheng ................... | B82Y 10/00 264/220 |
| 2012/0009795 A1 | 1/2012 | Endou et al. | |
| 2012/0214099 A1* | 8/2012 | Chen ..................... | G03F 7/0382 430/283.1 |
| 2014/0347643 A1* | 11/2014 | Kotoku ............... | G03F 7/70558 355/52 |

OTHER PUBLICATIONS

S. Tagawa et al., "Super High Sensitivity Enhancement by Photo-Sensitized Chemically Amplified Resist Process", Journal of Photopolymer Science and Technology, vol. 26, No. 6 (2013), pp. 825-830.

Taiwanese Patent Application No. 104126024, "Notification of Examination Opinions," Taiwanese Patent Application filing date Aug. 11, 2015, Notification of Examination Opinions dated Jul. 26, 2016.

* cited by examiner

CRITICAL DIMENSION CONTROL IN PHOTO-SENSITIZED CHEMICALLY-AMPLIFIED RESIST

CROSS REFERENCE TO RELATED APPLICATIONS

The present application claims the benefit of U.S. Provisional Patent Application No. 62/036,946, filed on Aug. 13, 2014, entitled "Critical Dimension Control in Photo-Sensitized Chemically-Amplified Resist," which is incorporated herein by reference in its entirety.

BACKGROUND OF THE INVENTION

Techniques disclosed herein relate to microfabrication and, in particular, relate to photolithography and patterning processes.

In material processing methodologies (such as photolithography), creating patterned layers typically involves the application of a thin layer of radiation-sensitive material, such as photoresist, to a surface of a substrate. This radiation-sensitive material is transformed into a patterned mask (relief pattern) that can be used to etch or transfer a pattern into an underlying layer on a substrate. Patterning of the radiation-sensitive material generally involves exposure by a radiation source through a photomask onto the radiation-sensitive material using, for example, a photolithography system and associated optics. This photomask-based exposure creates a latent pattern within the radiation-sensitive material which can then be developed. Particular wavelengths of light cause portions of the radiation-sensitive material exposed to this light to change its solubility by either becoming soluble or insoluble to a particular solvent or developer chemistry. Developing refers to dissolving and removing a portion of the radiation-sensitive material to yield a topographic or physical pattern, that is, a relief pattern. For example, developing can include removal of irradiated regions of the radiation-sensitive material (as in the case of positive photoresist), or non-irradiated regions (as in the case of negative resist) using a developing solvent. The relief pattern can then function as a mask layer for subsequent processing.

SUMMARY

A photo-sensitized chemically amplified resist (PS-CAR) is a resist composition formulated for a two-exposure treatment to fully create a latent pattern prior to developing the resist. Such double exposure differs from use of conventional photoresists wherein a single exposure of radiation through a photomask generates an area of de-protected (positive-tone) or protected (negative-tone) material that defines a soluble or insoluble area for subsequent development. A PS-CAR, in contrast, can include a non-chemically selective light exposure followed by a chemically selective light exposure prior to developing the resist. The first (non-chemically selective) exposure of the photoresist material typically occurs through a photomask at a first radiation wavelength or wavelength range. This first exposure creates areas in the photoresist that become sensitive to a secondary chemically-selective exposure. The second (chemically selective) exposure then causes these chemically-sensitive areas to change a solubility of the PS-CAR in those areas. A latent pattern is then fully created and such a resist film can then be developed into a relief pattern. More details on using photo-sensitized chemically amplified resists can be found in S. Tagawa et al., "Super High Sensitivity Enhancement by Photo-Sensitized Chemically Amplified Resist Process", Journal of Photopolymer Science and Technology, Vol. 26, Number 6 (2013), pp. 825-830.

Use of a PS-CAR enables higher sensitivity to photoresist lithographic patterning when photon density is low, such as when using EUV (extreme ultraviolet) wavelengths for exposure patterning. A photosensitizer is created during the initial EUV (or eBeam, or excimer laser such as using krypton fluorine, argon fluorine, etc.) exposure by the reaction of intermediates. A subsequent UV (ultraviolet) flood exposure enables the photosensitizer to cause a photo acid generator to generate acid, which in turn shifts a solubility of the PS-CAR. A choice of UV flood wavelength can be based on particular characteristics of a given photosensitizer. It is typically beneficial to select a wavelength (or wavelength range) that maximizes absorbance by the photosensitizer while minimizing the absorbance by the photo acid generator (PAG). Such optimization helps prevent the flood exposure from generating acid in areas in which no photosensitizer has been created. The excited photosensitizer, having absorbed UV light from the UV flood exposure, will then decompose PAGs in proximity to the photosensitizer. This decomposition amplifies acid generation in the exposed area while essentially keeping the lack of acid formation in dark areas from the initial EUV (or eBeam, or excimer laser) exposure. This means avoiding a DC-bias shift in films associated with flood UV exposure.

Although a photo-sensitized chemically amplified resist can enable EUV photolithography and other photolithography in which photo density or electron density is low, use of PS-CAR patterning can have challenges with critical dimension (CD) uniformity. CD uniformity can vary across a surface of a substrate. For example, a given wafer can have one CD value in a center portion of the wafer, while having another CD value closer to an edge of a wafer. A wafer can also have CDs that vary based on order of exposure progression, such as when using a stepper exposure system. Depending on the particular area of a given substrate, CDs may be too large or too small, and the CD variation may be spread randomly across the wafer, may be based on radial location, and/or may correlate with particular features such as location of scribe lanes.

Techniques disclosed herein include resist compositions for photosensitive chemically amplified resist processing, as well as methods for processing substrates using a photosensitive chemically amplified resist. Such techniques provide CD uniformity control in which minor corrections can be made to a given PS-CAR during processing to result in a relief pattern having improved CD uniformity.

One embodiment includes a method for patterning a substrate. This method can include receiving a substrate having a radiation-sensitive layer deposited on an underlying layer. The radiation-sensitive layer can be, for example, a photoresist film. In addition to typical polymer components of a photoresist film, the radiation-sensitive layer can include a photosensitizer generation compound that, when exposed to a first light wavelength, generates photosensitizer molecules in the radiation-sensitive layer. The radiation-sensitive layer can also include a photo acid generator compound that, when exposed to a second light wavelength, generates photo acid. The radiation-sensitive layer can also include a photo-active agent that, when exposed to a third light wavelength, modifies a concentration of photosensitizer in the radiation-sensitive layer. A lithographic exposure adjustment process can be executed that projects a pattern of radiation of the third light wavelength onto the radiation-sensitive layer using a digital pixel-based projection system having an array of independently addressable projection points. The projected pattern is based on a critical dimension signature that spatially characterizes critical dimension values of structures corresponding to the substrate. The lithographic exposure adjustment process modifies photosensitizer concentration based on the projected pattern. A lithographic exposure process can be executed that exposes the radiation-sensitive layer to radiation of the first light wavelength through a photomask such that photosensitizer molecules are generated in exposed portions of the radiation-sensitive layer. An exposure gain amplification process is executed that flood exposes the radiation-sensitive layer with radiation of the second light wavelength causing photo acid generation in the radiation-sensitive layer at locations of photosensitizer molecules. Subsequently, the radiation-sensitive layer can be developed to generate a relief pattern defined by the radiation sensitive layer. Accordingly, radiation-sensitive films can be patterned and fully developed with uniform critical dimensions even when initially patterned using a relatively low exposure dosage, such as with EUV films.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
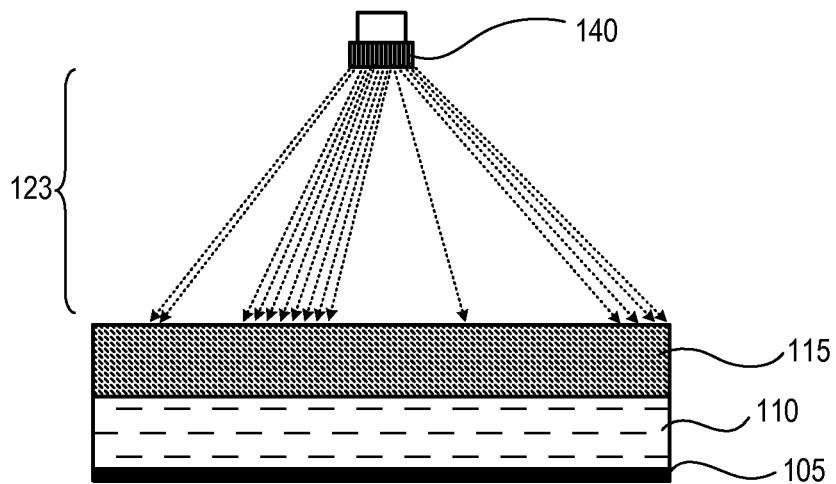
FIG. 1 is a cross-sectional schematic view of an example substrate segment showing a process flow according to embodiments disclosed herein.

Techniques disclosed herein include resist compositions for photosensitive chemically amplified resist processing, as well as methods for processing substrates using a photosensitive chemically amplified resist. Such techniques provide CD uniformity control in which minor corrections can be made to a given PS-CAR during processing to result in a relief pattern having improved CD uniformity. Accordingly, radiation-sensitive films can be patterned and fully developed with uniform critical dimensions even when initially patterned using a relatively low exposure dosage, such as with EUV films.

A photosensitive chemically-amplified resist (PS-CAR) includes a photoresist having a segregated activation capability that enables the generation of chemicals within the photoresist to occur at different times and under different process conditions prior to being developed. In one embodiment, generation of photosensitizer is isolated from acid amplification within the resist.

In one embodiment, a resist composition is created (or selected) to generate photosensitizer when the resist (as a film or layer on a substrate) is exposed to a first wavelength range of light. A second wavelength range of light is later used to amplify an acid reaction without using thermal diffusion. The first and second wavelength ranges may or may not overlap. In one embodiment, however, the segregated activation capability may overlap between the photosensitizer and a photo acid generator, such that a relatively small amount of acid may be generated during the first exposure. This relatively small amount of acid may be, for example, less than half an amount of acid that may be generated during a second exposure. Optionally, the photoresist may be optimized to minimize the reaction rate of the acid or an amount of acid that may be generated when the photoresist is exposed to the first wavelength range of light. Acid generation may also be minimized by passing light through a pattern that may reduce the amount of light that may intersect with photoresist during the first exposure of light. In a subsequent exposure step, the photoresist film is exposed to light again. This subsequent exposure can include a second wavelength range that induces or amplifies the acid concentration within the photoresist film. By way of a non-limiting example, the first wavelength range may be less than 300 nm and the second wavelength range may be greater than 300 nm.

In a conventional photoresist patterning process, a first light exposure activates a photo acid generator (PAG) at exposure locations such that photo acid is generated at those locations. The photo acid can then change a solubility of the photoresist film. In contrast, with a PS-CAR film a photomask-based pattern exposure of light primarily creates photosensitizers instead of acid (though some acid can be created). Photosensitizers can be created when actinic radiation from the photomask-based exposure activates a photosensitizer generation compound. This initial mask-based exposure can be considered a low-power exposure. Subsequently, a high-power UV flood exposure is executed that creates an enormous amount of acid relative to what was created with the mask-based exposure. Flood exposure herein refers to light exposure without any mask or patterning mechanism so that all portions of a substrate receive about a same amount of radiation.

Embodiments herein can include a resist composition that includes one or more photosensitizer generation compounds. Such compounds, respond to a particular light wavelength activation threshold by generating photosensitizer molecules in a photoresist layer or composition. Photosensitizer molecules can absorb light energy and transfer the light energy to another molecule, such as a PAG. This energy transfer can in turn activate the receiving molecule. In the case of a PAG receiving the energy transfer, the PAG can then generate acid. Some photosensitizer compounds may transfer energy in a ground state while others may conduct the transfer in an excited state. Exemplary photosensitizer generation compounds include, but are not limited to, acetophenone, triphenylene, benzophenone, flourenone, anthraquinone, phenanthrene, or derivatives thereof.

Resist compositions herein can also include a photo acid generation (PAG) compound. Such a PAG compound responds to a second light wavelength activation threshold that controls the generation of acid in the photoresist layer. The second activation wavelength can be different than the first activation wavelength. A photo acid generator (PAG) can be a cationic photoinitiator that converts absorbed light energy into chemical energy (e.g., an acidic reaction). The photo acid generation compound may include, but is not limited to triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane(DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

Embodiments herein can also include a photoactive agent that can modify acid concentration and/or concentration of a photosensitizer. The photoactive agent can include a second PAG, a thermal acid generator (TAG), or a photo-destructive base. A photo-destructive base can include one or more base compounds that can neutralize photo-active acids. A photo-destructive base thus includes compounds that can provide a general base loading effect, that is, adding base compounds to a material or film. After a particular base is generated, the base will denature one or more photo acids such that these photo acids are no longer photo-sensitive, or no longer sensitive to radiation. Common photoresist compositions typically include some type of a base load to help increase contrast to result in crisp lines. This base load typically acts to uniformly adjust acid concentration to provide a uniform profile (remove a gradient exposure). As disclosed herein, by adding more base to a given resist film, a given acid concentration can be reduced. Likewise, a given acid concentration can be increased by selectively adding acid compounds.

Referring now to FIG. 1, techniques herein can include methods for patterning a substrate. In one embodiment, a substrate 105 is received that has a radiation-sensitive layer 115 deposited on an underlying layer 110. Note that substrate 105 can include multiple additional underlying layers. An example radiation-sensitive layer 115 can include a photoresist. The radiation-sensitive layer 115 can comprise several components including a photosensitizer generation compound that, when exposed to a first light wavelength (wavelength range), generates photosensitizer molecules in the radiation-sensitive layer. Another component is a photo acid generator compound that, when exposed to a second light wavelength (or wavelength range), generates photo acid. A third component can include a photo-active agent that, when exposed to a third light wavelength/wavelength range, modifies a concentration of photosensitizer in the radiation-sensitive layer. The photo-active agent can include a photo-destructive base, a second photo acid generator compound, or a thermal acid generator compound. The photo-active agent can modulate a concentration either by adding a neutralizing base (decreasing concentration), or adding an additional acid (increasing concentration).

Example process methods include executing a lithographic exposure adjustment process that projects a pattern of radiation of the third light wavelength onto the radiation-sensitive layer using a digital pixel-based projection system 140 having an array of independently addressable projection points. The projected pattern can be based on a critical dimension signature that spatially characterizes critical dimension values of structures corresponding to the substrate. The lithographic exposure adjustment process modifies a photosensitizer concentration based on the projected pattern. As can be seen in FIG. 1, light of a third wavelength 123 is projected onto a surface of substrate 105. Note that in the example illustration, light of the third wavelength 123 can be projected to individual point locations on the substrate 105 and at different intensities.

In one embodiment, digital pixel-based projection system 140 can be embodied as a digital light processing (DLP) chip, grating light valve (GLV), or other micro projection technology, with a light source that can focus an image or pattern (optionally using a lens) onto a wafer and correct or adjust critical dimension non-uniformities. The projected pattern essentially provides a relatively small pre-dose or post-dose (small compared to lithographic exposure) that compensates for repeating non-uniformities produced from a given photolithographic exposure system or tool or fabrication sequence involving other tools (such as etch equipment), etc.

In one embodiment, a pixel-based light projection system is connected to a control computer of a lithography device, such as a coater/developer tool. The DLP can be focused through a lens system into an exposure chamber where a wafer is aligned. Light projected onto or at the wafer then activates a photo-active agent at desired areas of the wafer to a cause a desired change in photosensitizer concentration. In some embodiments, a given dosage of the third light wavelength can be less than around 7 mJ or even less than 3 mJ per centimeter squared. For the third light wavelength, various wavelengths can be used that are compatible with a given DLP chip or micro mirror projection system. The third light wavelength can be selected as l-line, 248 nm, 193 nm, and/or white light.

The critical dimension signature can characterize observed critical dimension values from a previously-measured substrate or group of substrates. A given critical dimension signature can be identified prior to executing the lithographic exposure adjustment process. Critical dimension signatures can be based on exposure characteristics of a specific photomask-based photolithography exposure system, etch non-uniformity from an etch system, wafer surface changes during layering processes, and/or a result of a particular fabrication sequence such as a combination of these processing steps. For example, a CD signature can be identified from a given wafer being processed by a particular photolithography system exposure and etch sequence combination, or by other factors in a given fabrication sequence. CDs on a given wafer can be affected by nuances of fabrications tools, masks, transfer operations, and so forth. For a particular fabrication system or process flow, CD variations tend to occur at specific locations on a wafer, and with specific amounts of variation. This signature is typically based on measured CDs on a given wafer that has gone through a particular fabrication sequence, such as a particular coating, exposure, developing, and etching sequence. After measuring and identifying a CD signature for a given (test) substrate, this signature can be used to correct CD variations on subsequent substrates that are processed using a same or similar fabrication sequence, tool set, etc.

Figure 7:
FIG. 7 is a top view representation of an example critical dimension signature as described herein.

FIG. 7 is an illustration depicting an example critical dimension signature. This critical dimension signature is mapped as point locations on the surface of a given substrate such as a wafer used in microfabrication processes. Note that various points on the CD signature illustration vary in degree of darkness or lightness. These relative differences at point locations on the CD signature illustration represent relative differences in CD uniformity. For example, point locations that are completely darkened can represent areas having CDs that are too small, whereas point locations that are completely lightened or appear lighter by comparison can represent areas having CDs that are too large. This CD signature can be generated based on observed or measured dimensions. This CD signature illustration can also represent what a given projection of the third light wavelength would look like on a substrate being treated (assuming the third light wavelength is in the visible spectrum), or what a light intensity measurement would display. Accordingly, point locations on a substrate surface receiving a full intensity of projected light can include the light or white areas in the illustration. Likewise, point locations with less whitespace can have a medium intensity or partial intensity of light being projected at those locations. Point locations shown as black squares in this illustration might receive no light or relatively little light exposure.

In one example embodiment that uses a photo-destructive base, areas receiving little or no light would have little or no base molecules generated to modulate photosensitizer concentration at those point locations. Likewise, areas receiving partial or full light would have more base molecules generated, which can then neutralize acid concentration and/or concentration of the photosensitizer in the radiation-sensitive layer at those point locations. Example embodiments in which the photo-active agent is a second photo acid generator, a given light projection pattern can be reversed because more acid molecules would be generated instead of more base molecules being generated. In other words, an acid concentration or base concentration can be used to change a photoresist by pixel. A given photoresist film can be made to vary composition by pixel prior to lithographic exposure or prior to flood exposure. The adjustment exposure modulates a photosensitizer concentration either by increasing or decreasing an acid concentration at spot locations across a substrate. A degree of projected resolution can be based on a given DLP chip and/or light projection system selected to be used and can provide far higher resolution than the CD signature illustration.

Figure 2:
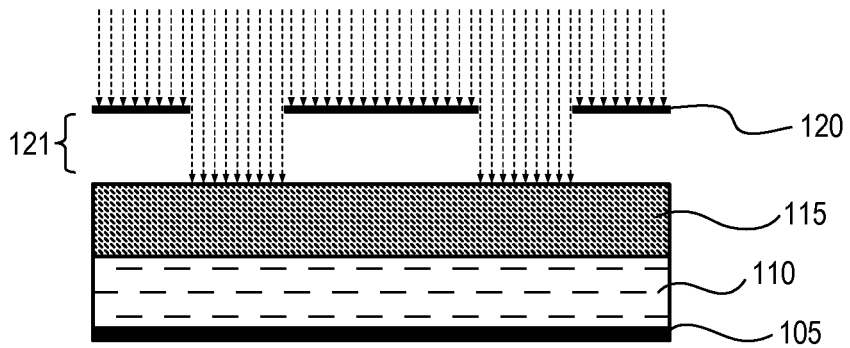
FIG. 2 is a cross-sectional schematic view of an example substrate segment showing a process flow according to embodiments disclosed herein.

Referring now to FIG. 2, a cross-sectional schematic is illustrated of an example substrate segment receiving a light treatment process. A lithographic exposure process is executed that exposes the radiation-sensitive layer to radiation of the first light wavelength 121 through a photomask 120 such that photosensitizer molecules are generated in exposed portions of the radiation-sensitive layer 115. In other words, a photolithographic exposure process can be executed using a conventional photolithography tool such as a scanner or stepper system. In some embodiments, the first light wavelength is selected from an extreme ultraviolet (EUV) light range. Due to exposure characteristics of conventional EUV exposure systems, example light dosages can range between 10 and 40 mJ per centimeter squared.

Figure 3:
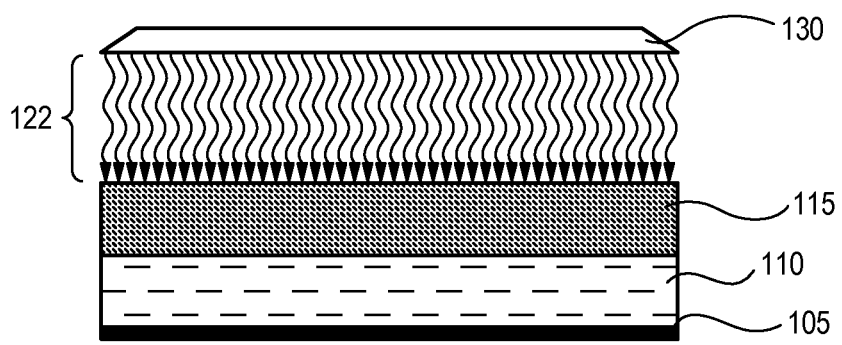
FIG. 3 is a cross-sectional schematic view of an example substrate segment showing a process flow according to embodiments disclosed herein.

Referring now to FIG. 3, a cross-sectional schematic is illustrated of an example substrate segment receiving a flood exposure process. Thus, an exposure gain amplification process is executed that flood exposes the radiation-sensitive layer with radiation of the second light wavelength 122 causing photo acid generation in the radiation-sensitive layer at locations of photosensitizer molecules. In other words, a comparatively intense light exposure chemically amplifies a photoresist film. The flood exposure process is essentially a process to improve signal gain. Flood exposure refers to the entire substrate being equal exposed to the second light wavelength 122 without using a photomask. Flood exposure can be executed using flood light source 130, which can be a lamp, a laser, a bulb, etc.

Prior to executing gain amplification process, photosensitizer molecules have been created in the radiation-sensitive film which included modulating concentration of the photosensitizer molecules to improve CD uniformity. Light from the flood exposure process causes these photosensitizer molecules to create photo acid, which in turn changes or shifts a solubility of the radiation-sensitive layer at locations in which photo acid has been created. This solubility shift can make selected portions of the radiation-sensitive layer insoluble or soluble to a given developer. Locations in the resist that have no photosensitizer molecules, or have photosensitizer molecules below a particular threshold, are largely unaffected by the flood exposure or can be designed to be largely unaffected by the flood exposure.

In various embodiments, the lithographic exposure adjustment process can be executed prior to executing the lithographic exposure process, or subsequent to executing the lithographic exposure process. In other words, DLP projection of a light pattern to improve CD uniformity can be executed as a pre-dose prior to a given lithographic (mask-based) exposure, or can be executed as a post-exposure adjustment process after a given lithographic exposure. Note, however, that both the lithographic exposure adjustment process and the lithographic exposure process benefit from being executed prior to the exposure gain amplification process. After executing a flood exposure, adjusting CDs by digital light projection is generally difficult. The post-processing or flood dose is on the order of hundreds of times or thousands of times greater than the lithographic exposure. For example, flood exposure can be in the Joules of dose, for example, 1-10 Joules of light exposure, versus 1-30 millijoules of lithographic exposure of EUV per centimeter squared. Thus, a pre-dose can be a comparatively light dose of about three mJ or so.

In some embodiments, the second light wavelength and the third light wavelength can be the same or be within a same light wavelength range. In some embodiments, the third wavelength (pixel-based lithographic adjustment) and the second wave length (amplification dose) can be a same wavelength. In such embodiments, it is beneficial to complete a post-exposure bake prior to amplification exposure. Baking can cross-link or otherwise denature the photo-active agent used to adjust lithographic exposure results (pre-litho adjustment or post-litho adjustment). After a denaturing treatment, the photo-active agent can be prevented from participating in the amplification dose. Denaturing is typically not needed in other embodiments in which the photoactive agent responds to a different wavelength than that used for amplification.

Figure 4A:
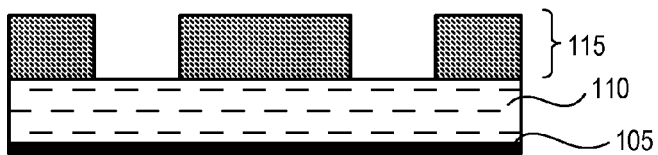
FIGS. 4A and 4B are a cross-sectional schematic views of an example substrate segment showing a process flow according to embodiments disclosed herein.
Figure 4B:
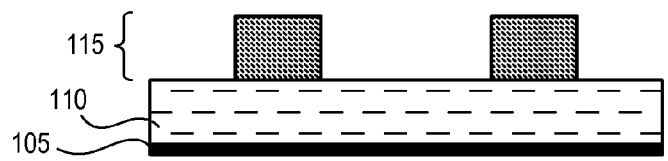
Figure 5A:
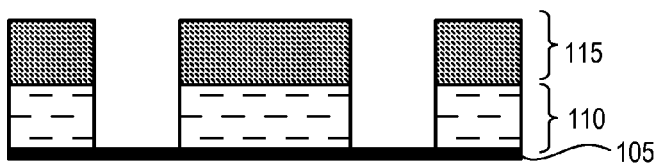
FIGS. 5A and 5B are a cross-sectional schematic views of an example substrate segment showing a process flow according to embodiments disclosed herein.
Figure 5B:
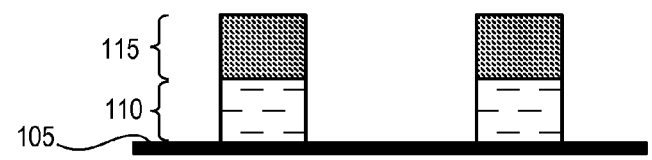
Figure 6A:
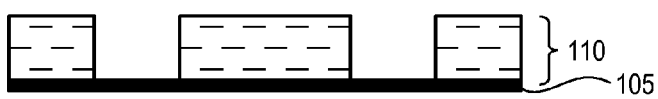
FIGS. 6A and 6B are a cross-sectional schematic views of an example substrate segment showing a process flow according to embodiments disclosed herein.
Figure 6B:

After completing the exposure gain amplification process, subsequent processing can then be continued on the substrate. For example, a latent pattern can be developed in the radiation-sensitive layer resulting in the radiation-sensitive layer defining a relief pattern. FIG. 4A and FIG. 4B show example cross-sectional schematics after a developing step has been completed. FIG. 4A illustrates how exposed portions (from FIG. 2) are removed such that radiation-sensitive layer 115 defines a relief pattern. This relief pattern can then be used as an etch mask to transfer this pattern into an underlying layer 110 as shown in FIG. 5A. After pattern transfer, the radiation-sensitive layer 115 can be removed thereby resulting in the underlying layer 110 being a patterned layer as shown in FIG. 6A. Note that techniques herein can also be used in the context of negative tone developer for pattern reversal in which the exposed portions from FIG. 2 of the radiation-sensitive layer remain on the underlying layer 110 while the unexposed portions are removed during the developing process such that a reverse latent pattern can be developed into a relief pattern transferred into the underlying layer 110 as illustrated in FIGS. 4B, 5B, and 6B.

Accordingly, techniques herein improve patterning operations for patterning and developing photoresist films. Methods herein enable photoresist films—including EUV photoresist films—to be patterned and fully developed with uniform critical dimensions.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
receiving a substrate having a radiation-sensitive layer deposited on an underlying layer, the radiation-sensitive layer comprising (1) a photosensitizer generation compound that, when exposed to a first light wavelength, generates photosensitizer molecules in the radiation-sensitive layer,(2) a photo acid generator compound that, when exposed to a second light wavelength, generates photo acid, and (3) a photo-active agent that, when exposed to a third light wavelength, modifies a concentration of photosensitizer in the radiation-sensitive layer;
executing a lithographic exposure adjustment process that projects a pattern of radiation of the third light wavelength onto the radiation-sensitive layer using a digital pixel-based projection system having an array of independently addressable projection points, the projected pattern being based on a critical dimension signature that spatially characterizes critical dimension values of structures corresponding to the substrate, the lithographic exposure adjustment process modifying photosensitizer concentration based on the projected pattern;
executing a lithographic exposure process that exposes the radiation-sensitive layer to radiation of the first light wavelength through a patterned mask such that photosensitizer molecules are generated in exposed portions of the radiation-sensitive layer; and
executing an exposure gain amplification process that flood exposes the radiation-sensitive layer with radiation of the second light wavelength causing photo acid generation in the radiation-sensitive layer at locations of photosensitizer molecules.

2. The method of claim 1, wherein the photoactive agent is a second photo acid generator compound.

3. The method of claim 1, wherein the lithographic exposure adjustment process is executed prior to executing the lithographic exposure process, and the lithographic exposure process is executed prior to executing the exposure gain amplification process.

4. The method of claim 1, wherein the lithographic exposure adjustment process is executed subsequent to executing the lithographic exposure process, and the lithographic exposure process is executed prior to executing the exposure gain amplification process.

5. The method of claim 1, wherein first light wavelength is selected from an EUV (extreme ultraviolet) light range.

6. The method of claim 1, wherein the lithographic exposure adjustment projects the third light wavelength at less than seven millijoules per centimeter squared.

7. The method of claim 6, wherein the third light wavelength has a light wavelength selected from the group consisting of I-line, 248 nm, 193 nm, and white light.

8. The method of claim 1, wherein the second light wavelength and the third light wavelength are the same.

9. The method of claim 1, wherein the second light wavelength and the third light wavelength are different.

10. The method of claim 1, wherein critical dimension signature characterizes observed critical dimension values from a previously-measured substrate.

11. The method of claim 1, wherein the critical dimension signature is identified prior to executing the lithographic exposure adjustment process.

12. The method of claim 1, wherein the critical dimension signature is based on exposure characteristics of a specific photolithography exposure system that uses a photomask.

13. The method of claim 1, further comprising:
developing a latent pattern in the radiation-sensitive layer resulting in the radiation-sensitive layer defining a relief pattern; and
transferring the relief pattern into the underlying layer using the radiation-sensitive layer as an etch mask.

14. The method of claim 1, further comprising:
developing a latent pattern in the radiation-sensitive layer after executing all of the lithographic exposure adjustment process, the lithographic exposure process, and the exposure gain amplification process.

15. A method for patterning a substrate, the method comprising:
receiving a substrate having a radiation-sensitive layer deposited on an underlying layer, the radiation-sensitive layer comprising (1) a photosensitizer generation compound that, when exposed to a first light wavelength, generates photosensitizer molecules in the radiation-sensitive layer,(2) a photo acid generator compound that, when exposed to a second light wavelength, generates photo acid, and (3) a photo-active agent that, when exposed to a third light wavelength, modifies a concentration of photosensitizer in the radiation-sensitive layer, wherein the photoactive agent is a photo-destructive base;
executing a lithographic exposure adjustment process that projects a pattern of radiation of the third light wavelength onto the radiation-sensitive layer using a digital pixel-based projection system having an array of independently addressable projection points, the projected pattern being based on a critical dimension signature that spatially characterizes critical dimension values of structures corresponding to the substrate, the lithographic exposure adjustment process modifying photosensitizer concentration based on the projected pattern;
executing a lithographic exposure process that exposes the radiation-sensitive layer to radiation of the first light wavelength through a patterned mask such that photosensitizer molecules are generated in exposed portions of the radiation-sensitive layer; and
executing an exposure gain amplification process that flood exposes the radiation-sensitive layer with radiation of the second light wavelength causing photo acid generation in the radiation-sensitive layer at locations of photosensitizer molecules.

16. A method for patterning a substrate, the method comprising:
receiving a substrate having a radiation-sensitive layer deposited on an underlying layer, the radiation-sensitive layer comprising (1) a photosensitizer generation compound that, when exposed to a first light wavelength, generates photosensitizer molecules in the radiation-sensitive layer,(2) a photo acid generator compound that, when exposed to a second light wavelength, generates photo acid, and (3) a photo-active agent that, when exposed to a third light wavelength, modifies a concentration of photosensitizer in the radiation-sensitive layer, wherein the photoactive agent is a thermal acid generator compound;
executing a lithographic exposure adjustment process that projects a pattern of radiation of the third light wavelength onto the radiation-sensitive layer using a digital pixel-based projection system having an array of independently addressable projection points, the projected pattern being based on a critical dimension signature that spatially characterizes critical dimension values of structures corresponding to the substrate, the lithographic exposure adjustment process modifying photosensitizer concentration based on the projected pattern;
executing a lithographic exposure process that exposes the radiation-sensitive layer to radiation of the first light wavelength through a patterned mask such that photosensitizer molecules are generated in exposed portions of the radiation-sensitive layer; and
executing an exposure gain amplification process that flood exposes the radiation-sensitive layer with radiation of the second light wavelength causing photo acid generation in the radiation-sensitive layer at locations of photosensitizer molecules.

* * * * *